United States Patent
Sakaue

(10) Patent No.: US 10,340,175 B2
(45) Date of Patent: Jul. 2, 2019

(54) SUBSTRATE TRANSFER TEACHING METHOD AND SUBSTRATE PROCESSING SYSTEM

(71) Applicant: TOKYO ELECTRON LIMITED, Tokyo (JP)

(72) Inventor: Hiromitsu Sakaue, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 113 days.

(21) Appl. No.: 15/422,293

(22) Filed: Feb. 1, 2017

(65) Prior Publication Data
US 2017/0217017 A1    Aug. 3, 2017

(30) Foreign Application Priority Data

Feb. 1, 2016    (JP) .................................. 2016-016954

(51) Int. Cl.
*H01L 21/687*    (2006.01)
*H01L 21/67*    (2006.01)
*H01L 21/677*    (2006.01)
*H01L 21/68*    (2006.01)

(52) U.S. Cl.
CPC .. *H01L 21/68742* (2013.01); *H01L 21/67259* (2013.01); *H01L 21/67748* (2013.01); *H01L 21/681* (2013.01); *Y10S 901/03* (2013.01); *Y10S 901/46* (2013.01)

(58) Field of Classification Search
CPC ................ B25J 9/163; H01L 21/67259; H01L 21/67748; H01L 21/681; H01L 21/68742; Y10S 901/46; Y10S 901/03
See application file for complete search history.

(56) References Cited

U.S. PATENT DOCUMENTS

| 5,339,128 | A | * | 8/1994 | Tateyama | ................ B29C 31/00 |
| | | | | | 396/604 |
| 5,445,491 | A | * | 8/1995 | Nakagawa | ............... C23C 16/54 |
| | | | | | 414/217 |
| 6,643,564 | B2 | * | 11/2003 | Kataoka | ............ H01L 21/67259 |
| | | | | | 250/206.1 |
| 2003/0139852 | A1 | | 7/2003 | Kataoka et al. | |
| 2010/0030347 | A1 | * | 2/2010 | Shindo | .............. H01L 21/67259 |
| | | | | | 700/59 |

(Continued)

FOREIGN PATENT DOCUMENTS

| JP | H11-163086 | 6/1999 |
| JP | 2003-218186 | 7/2003 |

*Primary Examiner* — Rachid Bendidi
(74) *Attorney, Agent, or Firm* — Fenwick & West LLP

(57) ABSTRACT

A method includes a first step of vertically moving the arm or the pins from a reference position in one direction by a predetermined distance, a second step of moving the arm in a horizontal direction, a third step of vertically moving the arm or the pins moved in the one direction in the other direction by a distance equal to or greater than the predetermined distance, a fourth step of detecting a horizontal position of the substrate held by the arm with respect to the arm. The steps are repeated. Whenever the processes are performed, the reference position in the first step is shifted in the one direction by the predetermined distance, and a vertical position of the arm or the pins which is obtained when the horizontal position of the substrate detected in the fourth step is deviated from a preset position is taught as the delivery position.

11 Claims, 12 Drawing Sheets

(56) References Cited

U.S. PATENT DOCUMENTS

2011/0015774 A1* 1/2011 Owaki .................... H01L 21/68
  700/110
2015/0371894 A1* 12/2015 Kaneda ............. H01L 21/02118
  438/694

* cited by examiner

SUBSTRATE TRANSFER TEACHING METHOD AND SUBSTRATE PROCESSING SYSTEM

CROSS-REFERENCE TO RELATED APPLICATION

This application claims priority to Japanese Patent Application No. 2016-016954 filed on Feb. 1, 2016, the entire contents of which are incorporated herein by reference.

FIELD OF THE INVENTION

The disclosure relates to a method for teaching a transfer position in a vertical direction in the case of transferring a substrate between an arm of a transfer unit and pins of a processing apparatus, and a substrate processing system for performing the teaching method.

BACKGROUND OF THE INVENTION

For example, in a process of manufacturing a semiconductor device, a liquid crystal display or the like, various processes such as film formation, etching, oxidation and the like are performed on a semiconductor substrate or a substrate for use in liquid crystal display (hereinafter, simply referred to as "wafer") in separate processing apparatuses. When a wafer is loaded into and unloaded from a processing apparatus, a transfer unit having a transfer arm for holding the wafer is generally used.

The transfer unit is provided in, e.g., the processing apparatus. The transfer unit needs to accurately transfer the wafer to a wafer delivery unit including a plurality of support pins. Especially, a wafer transfer position of the transfer arm needs to be accurately aligned with a height position of leading ends of the support pins at the time of contact with the wafer on the transfer arm, i.e., a support position of the support pins. When the transfer position of the transfer arm is not accurately aligned with the support position of the support pins, the wafer may interfere with the transfer arm or the support pins, or the wafer may not be delivered to the transfer arm or the support pins.

However, during the operation of the transfer unit, the transfer arm does not access the accurate transfer position due to various errors such as manufacturing errors of components of the transfer arm, installation errors of the respective components, assembly errors of the transfer unit, and the like, which results in deviation from the accurate transfer position. Also, the support pins may be deviated from the accurate support position for the same reason.

Therefore, in a conventional case, a teaching (transfer teaching) operation for a delivery position of a wafer in a vertical direction is performed before the actual transfer of the wafer. The teaching operation may employ various methods.

For example, Japanese Patent Application Publication No. 2003-218186 suggests a technique for teaching a delivery position of a wafer to a transfer arm by using a teaching jig. The jig is a circular plate having substantially the same size as that of the wafer. A camera and an optical sensor are provided at the circular plate. In that case, the circular plate that is the jig is transferred to a position above a mounting table in a state where a peripheral portion of the circular plate is held by the transfer arm. Then, the circular plate is relatively moved within a horizontal plane, and the camera monitors the relative movement. The center of the circular plate is made to coincide with a known central target. Then, the circular plate is relatively moved in a vertical direction, and leading ends of support pins are detected by the optical sensor. A position obtained by relatively moving the transfer arm with respect to the circular plate by a distance exceeding at least a thickness of the transfer arm from the detected positions of the leading ends of the support pins is calculated by operation. The position thus obtained is taught as a wafer delivery position to the transfer arm.

In addition, for example, Japanese Patent Application Publication No. H11-163086 suggests a teaching jig having two optical sensors. In that case, the jig is set at an arm and the arm is made to access wafer delivery parts (support pins). As a consequence, the support pins and the jig are in a close state. At this time, the optical sensors sense the support pins. The arm is moved in ±θ, ±X and +Z directions, and positions at which the respective optical sensors become ON•OFF are stored as positional information. An accurate transfer position to be accessed by the arm is set based on the positional information on the θ-axis, X-axis and Z-axis.

Although a general apparatus has a sensor for sensing a horizontal position of a wafer, it is difficult to perform teaching of a delivery position of the wafer in a vertical direction by the sensor. Therefore, the teaching jig is required in a conventional case as described in Japanese Patent Application Publication Nos. 2003-218186 and H11-163086. However, in the case of using the teaching jig, a teaching becomes complicated and a cost is increased. Therefore, the teaching of the wafer delivery position needs to be improved.

SUMMARY OF THE INVENTION

In view of the above, the disclosure provides a technique for efficiently teaching a delivery position in a vertical direction in the case of delivering a substrate between an arm of a transfer unit and pins of a processing apparatus.

In accordance with a first aspect of the present disclosure, there is provided a method for teaching a delivery position in a vertical direction in a case of delivering a substrate between an arm of a transfer unit and pins of a processing apparatus, the method including: a first step of vertically moving the arm or the pins from a reference position in one direction by a predetermined distance; a second step of moving the arm in a horizontal direction; a third step of vertically moving the arm or the pins moved in the one direction in the other direction by a distance equal to or greater than the predetermined distance; a fourth step of detecting a horizontal position of the substrate held by the arm with respect to the arm, wherein a series of processes from the first step to the fourth step are repeated, and whenever the series of the processes are performed, the reference position in the first step is shifted in the one direction by the predetermined distance, and a vertical position of the arm or the pins which is obtained when the horizontal position of the substrate detected in the fourth step is deviated from a preset position is taught as the delivery position.

In accordance with a second aspect of the present disclosure, there is provided a substrate processing system including: a processing apparatus configured to process a substrate; a transfer unit configured to transfer the substrate with respect to the processing apparatus, the transfer unit having an arm configured to hold the substrate and movable in a horizontal direction or movable in a vertical direction and a horizontal direction; pins provided in the processing apparatus and configured to support the substrate, the pins being movable in a vertical direction; a position detection unit configured to detect a horizontal position of the substrate with respect to the arm; a control unit configured to teach a delivery position in a vertical direction in a case of delivering the substrate between the pins and the arm, wherein the control unit configured to control the pins, the arm and the position detection unit to perform a first step of vertically moving the arm or the pins from a reference position in one direction by a predetermined distance, a second step of moving the arm in a horizontal direction, a third step of vertically moving the arm or the pins moved in the one direction in the other direction by a distance equal to or greater than the predetermined distance, a fourth step of detecting a horizontal position of the substrate held by the arm with respect to the arm, wherein a series of processes from the first step to the fourth step are repeated, and whenever the series of the processes are performed, the reference position in the first step is shifted in the one direction by the predetermined distance, and a vertical position of the arm or the pins which is obtained when the horizontal position of the substrate detected in the fourth step is deviated from a preset position is taught as the delivery position

BRIEF DESCRIPTION OF THE DRAWINGS

The objects and features of the disclosure will become apparent from the following description of embodiments, given in conjunction with the accompanying drawings, in which:

FIGS. 5A to 5H are explaining views for a teaching operation in a first embodiment, wherein FIGS. 5A to 5G are side views showing states of a transfer arm and support pins in the first time, and FIG. 5H schematically shows movement of the transfer arm in the respective steps shown in FIGS. 5A to 5G;

FIGS. 6A to 6G are views for explaining the teaching operation of the first embodiment, wherein FIGS. 6A to 6G are side views showing states of the transfer arm and the support pins in the $n^{th}$ time;

FIGS. 7A to 7F are views for explaining a teaching operation in a second embodiment, wherein FIGS. 7A to 7E are side views showing states of the transfer arm and the support pins, wherein FIG. 7F schematically shows movement of the transfer arm in the respective steps shown in FIGS. 7A to 7E;

FIGS. 8A to 8F are views for explaining a teaching operation in a third embodiment, wherein FIGS. 8A to 8E are side views showing states of the transfer arm and the support pins, and FIG. 8F schematically shows movement of the transfer arm (indicated by solid arrows) and movement of the support pins (indicated by dotted arrows) in the respective steps shown in FIGS. 8A to 8E;

FIGS. 9A to 9H are views for explaining a teaching operation in a fourth embodiment, wherein FIGS. 9A to 9G are side views showing states of the transfer arm and the support pins, and FIG. 9H schematically shows movement of the transfer arm (indicated by solid arrows) and movement of the support pins (indicated by dotted arrows) in the respective steps shown in FIGS. 9A to 9G.

DETAILED DESCRIPTION OF THE EMBODIMENTS

Figure 1:
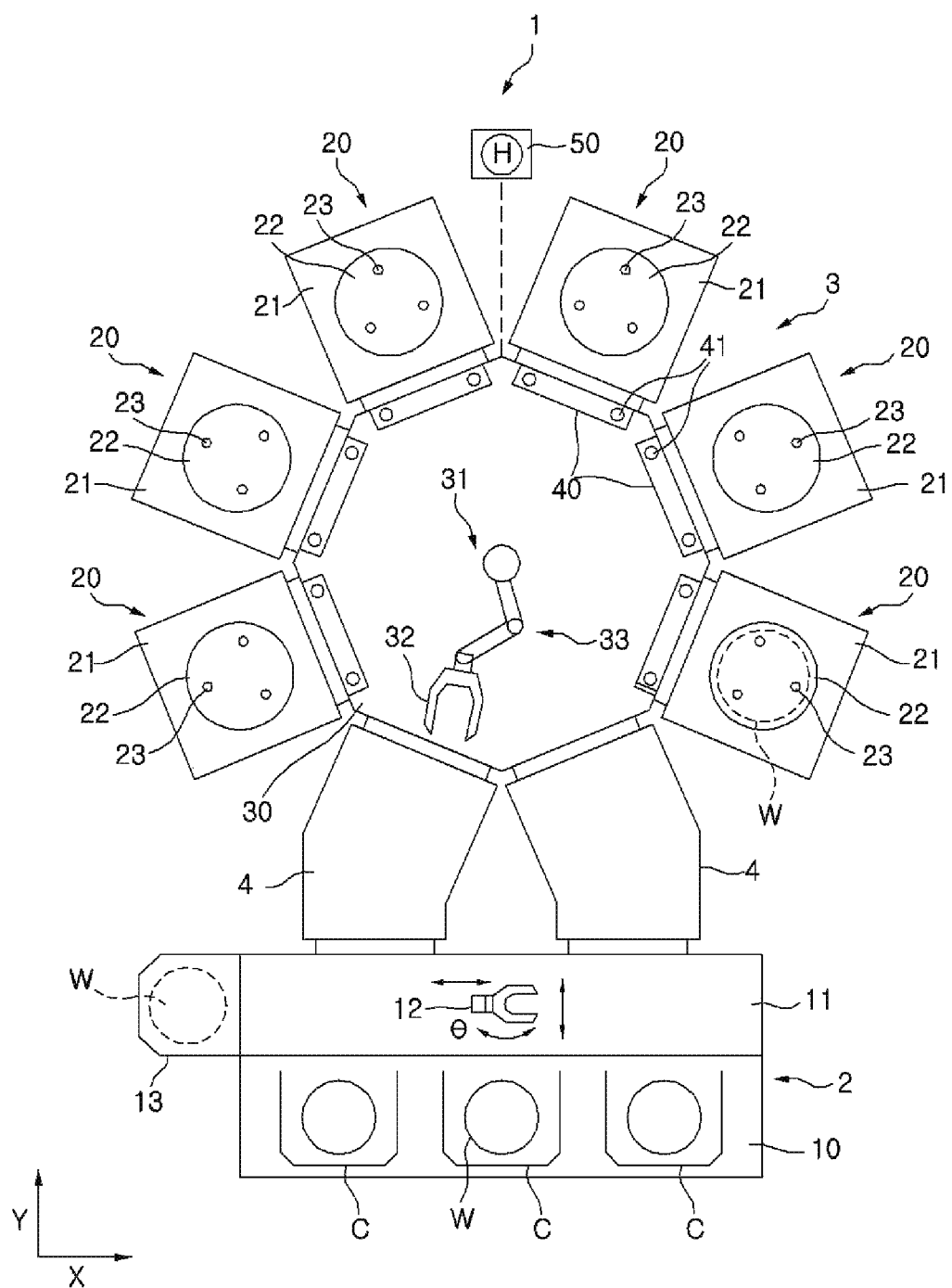
FIG. 1 is a top view schematically showing a configuration of a substrate processing system according to an embodiment.

Hereinafter, embodiments will be described in detail with reference to the accompanying drawings which form a part hereof. Like reference numerals will be used for like parts having substantially the same functions throughout the specification and the drawings, and redundant description thereof will be omitted.

1. Substrate Processing System

First, a configuration of a substrate processing system according to an embodiment will be described. FIG. 1 is a top view schematically showing a configuration of the substrate processing system. A substrate processing system 1 of the present embodiment performs a predetermined process on a wafer W as a substrate.

The substrate processing system 1 includes a cassette station 2 for loading/unloading wafers W to/from the substrate processing system 1 in the unit of a cassette C, and a processing station 3 for processing a wafer W. The cassette station 2 and the processing station 3 are connected as one unit through load-lock chambers 4.

The cassette station 2 has a cassette mounting unit 10, and a transfer chamber 11 adjacent to the cassette mounting unit 10. On the cassette mounting unit 10, a plurality of, e.g., three, cassettes C each of which is capable of accommodating a plurality of wafers W can be arranged in an X direction (right-left direction in FIG. 1). In the transfer chamber 11, a wafer transfer unit 12 is provided. The wafer transfer unit 12 is movable in an up-down direction, in a right-left direction and about a vertical axis (θ direction in the drawing). The wafer transfer unit 12 can transfer a wafer W between the cassette C on the cassette mounting unit 10 and the load-lock chambers 4. Provided at an end portion of the transfer chamber 11 on a negative side of the X direction is an alignment unit 13 for aligning the wafer W by recognizing a notch or the like of the wafer W.

The processing station 3 has a plurality of processing apparatuses 20 for processing wafers W and a polygonal (octagonal in the illustrated example) vacuum transfer chamber 30. The processing apparatuses 20 are arranged to surround the vacuum transfer chamber 30. The load-lock chambers 4 are connected to the vacuum transfer chamber 30.

Figure 2:
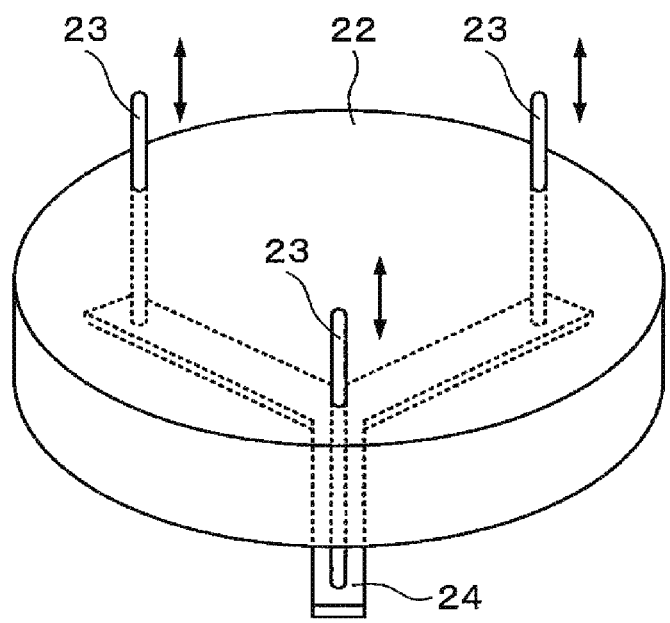
FIG. 2 is a perspective view schematically showing a mounting table and support pins.

The processing apparatus 20 has a processing chamber 21 of which inside can be hermetically closed. A mounting table 22 for mounting thereon the wafer W and support pins 23 for delivering the wafer W to and from the mounting table 22 are provided in the processing chamber 21 in order to perform a predetermined process on the wafer W. As shown in FIG. 2, the support pins 23 penetrate through the mounting table 22. Further, the support pins 23 are provided at, e.g., three locations, at a regular interval and arranged concentrically with an axis of the mounting table 22. The three support pins 23 are supported at a support member 24 provided below the mounting table 22. The support member 24 is coupled to an elevation mechanism (not shown), so that the three support pins 23 can be vertically moved. The process performed in the processing apparatus 20 is not particularly limited and may be arbitrarily set.

As shown in FIG. 1, a wafer transfer unit 31 for transferring the wafer W is provided in the vacuum transfer chamber 30. The wafer transfer unit 31 includes a transfer arm 32 for holding the wafer W and a rotatable, extensible and contractible multi-joint arm mechanism 33. The wafer transfer unit 31 can transfer the wafer W between the transfer chamber 30 and the load-lock chambers 4 and between the transfer chamber 30 and the processing apparatuses 20. Although FIG. 1 shows a single arm mechanism 33 provided at a central portion of the vacuum transfer chamber 30, there may be provided a plurality of arm mechanisms 33.

Figure 3:
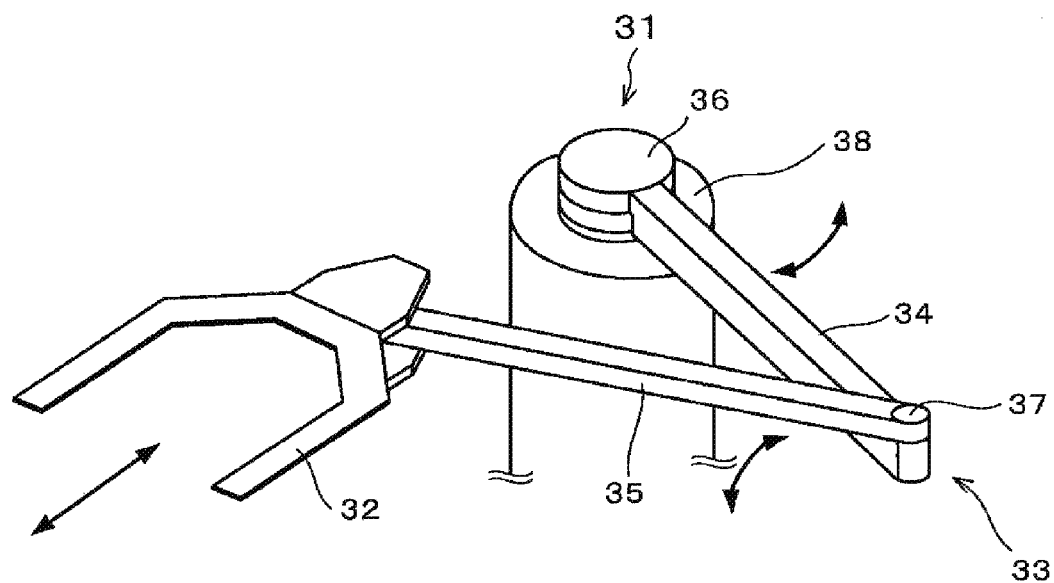
FIG. 3 is a perspective view schematically showing a configuration of a wafer transfer unit.

As shown in FIG. 3, the arm mechanism 33 has a linear first arm 34, and a linear second arm 35 connected to the first arm 34. A base end portion of the first arm 34 is connected to a central hub 36. The first arm 34 is configured to rotate about a center of the central hub 36. A joint 37 is provided between a leading end portion of the first arm 34 and a base end portion of the second arm 35. The second arm 35 is configured to rotate about the joint 37. A transfer arm 32 is provided at a leading end portion of the second arm 35. A motor 38 is connected to the central hub 36. The motor 38 enables the arm mechanism 33 to extend and contract in a horizontal direction and enables the transfer arm 32 to move in the horizontal direction. Further, the motor 38 enables the arm mechanism 33 to move in a vertical direction and enables the transfer arm 32 to move in the vertical direction. The motor 38 is provided with an encoder (not shown). The moving amount of the transfer arm 32, i.e., the horizontal position and the vertical position of the transfer arm 32, can be obtained by the encoder.

As shown in FIG. 1, a loading/unloading port 40 through which the wafer W is transferred (loaded/unloaded) to and from the processing apparatus 20 is provided at a boundary between the processing apparatus 20 and the vacuum transfer chamber 30, and sensors 41 for detecting passage of the wafer W are provided on both sides of the loading/unloading port 40 for each of the processing apparatuses 20. The sensor 41 has a light emitting part and a light receiving part. The light emitting part and the light receiving part face each other in a vertical direction so that the transfer arm 32 (wafer W) can be moved therebetween. The sensor 41 detects the wafer W held by the transfer arm 32. The configuration of the sensors 41 may vary without being limited to that of the present embodiment. For example, a sensor in which a light emitting part and a light receiving part are formed as one unit may be provided as the sensor 41 at an upper portion of the loading/unloading port 40. In the present embodiment, the sensors 41 and the encoder of the motor 38 constitute a position detection mechanism of the present disclosure.

The substrate processing system 1 includes a control unit 50. The control unit 50 is, e.g., a computer, and has a program storage unit (not shown). The program storage unit stores a program for controlling processing of the wafer W in the substrate processing system 1. The program storage unit also stores a program for controlling an operation of the aforementioned various processing apparatuses or a driving system such as the transfer unit or the like. The program may be stored in a computer-readable storage medium, e.g., a computer-readable hard disk, a flexible disk, a compact disk, a magneto-optical disk, a memory card or the like, and installed in the control unit 50 from the storage medium.

2. First Embodiment of Teaching

Figure 4:
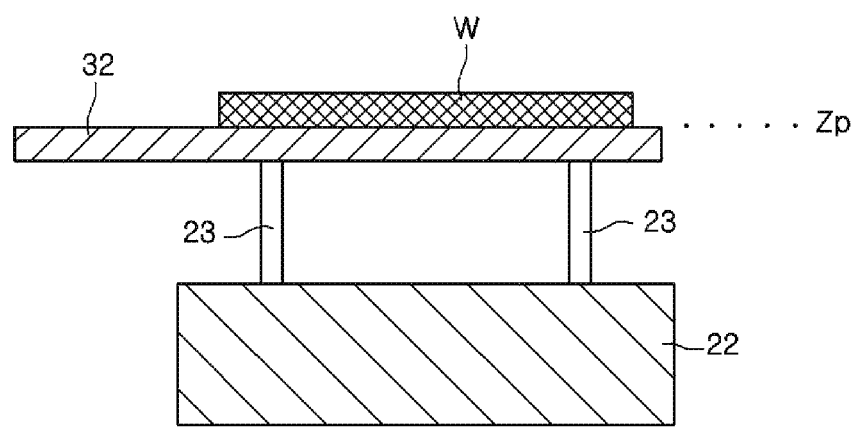
FIG. 4 explains a transfer position of a wafer between a transfer arm and the support pins.

The following is description on the teaching of the delivery position of the wafer W which is performed by the substrate processing system 1 configured as described above. As shown in FIG. 4, a delivery position Zp of the wafer W is a position where a transfer position (top surface) of the transfer arm 32 and a support position (leading end portions) of the support pins 23 are on the same plane. The wafer W used for the teaching may be a product wafer or a dummy wafer (bare wafer).

First, a first embodiment of the teaching of the delivery position of the wafer W will be described. In the first embodiment, in order to perform the teaching, the transfer arm 32 is moved in a vertical direction in a state where the wafer W is supported by the support pins 23. Before the teaching is performed, a space that is enough for the transfer arm 32 to move in a vertical direction is ensured between a backside of the wafer W supported by the support pins 23 and a top surface of the mounting table 22. Further, before the teaching is performed, rough teaching having low positional accuracy may be performed manually, for example. These preliminary operations are also applied to a second embodiment to a fourth embodiment to be described later.

Figure 5A:
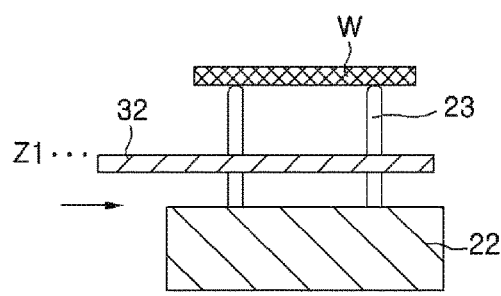
Figure 5B:
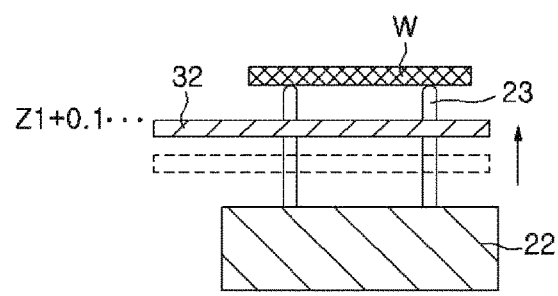
Figure 5C:
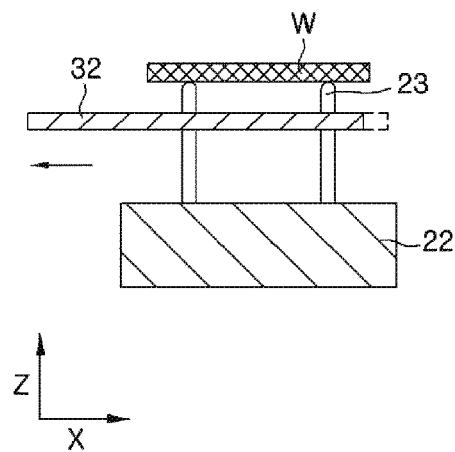
Figure 5D:
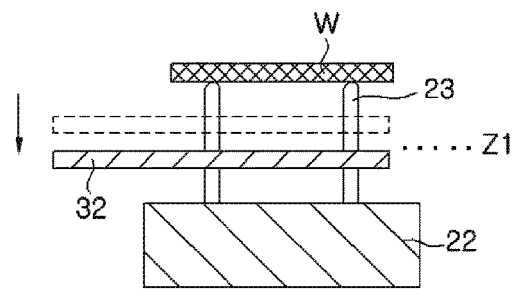
Figure 5E:
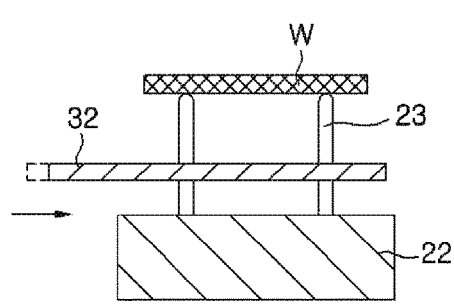
Figure 5F:
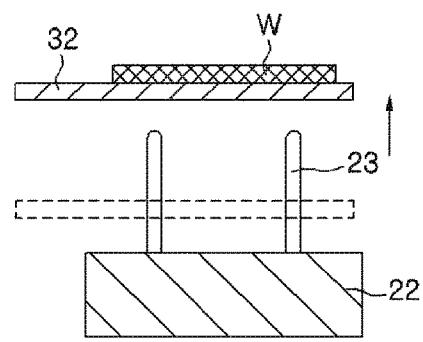
Figure 5G:
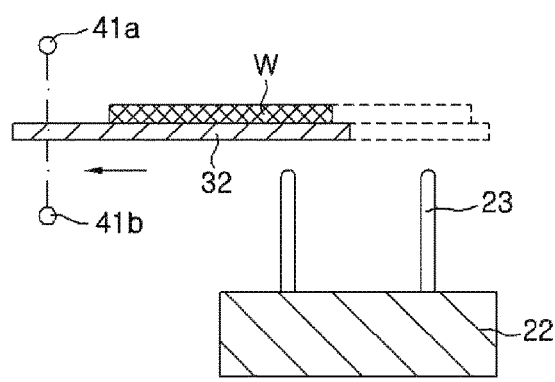
Figure 5H:
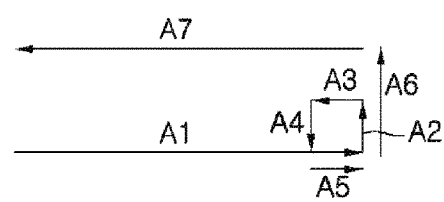
Figure 5H:
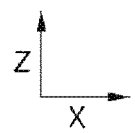

FIGS. 5A to 5H are views for explaining the teaching operation of the first embodiment. FIGS. 5A to 5G are side views showing states of the transfer arm 32 and the support pins 23. FIG. 5H schematically shows movement of the transfer arm 32 in the respective steps shown in FIGS. 5A to 5G.

First, as shown in FIG. 5A, the transfer arm 32 is moved in a horizontal direction and positioned above the mounting table 22 (step A1 in FIG. 5H). At this time, the height position of the top surface of the transfer arm 32 is a reference position Z1. Further, the horizontal position of the transfer arm 32 is an appropriate position for receiving the wafer W by the transfer arm 32.

Next, as shown in FIG. 5B, the transfer arm 32 is moved upward by a predetermined distance, e.g., 0.1 mm (step A2 in FIG. 5H). At this time, the top surface of the transfer arm 32 is not in contact with the backside of the wafer W supported by the support pins 23. The predetermined distance is not limited to 0.1 mm, and may be, e.g., 0.2 mm to 0.3 mm.

Then, as shown in FIG. 5C, the transfer arm 32 is moved in a horizontal direction by a predetermined distance, e.g., 1 mm (step A3 in FIG. 5H). At this time, the transfer arm 32 may be moved toward the vacuum transfer chamber 30 side (in the negative X direction) or may be moved toward the side opposite to the vacuum transfer chamber 30 (in the positive X direction). In the present embodiment, the transfer arm 32 is moved in the negative X direction.

Thereafter, as shown in FIG. 5D, the transfer arm 32 is moved downward by a predetermined direction, e.g., 0.1 mm (step A4 in FIG. 5H). In other words, the height position of the top surface of the transfer arm 32 returns to the reference position Z1.

Next, as shown in FIG. 5E, the transfer arm 32 is moved in a horizontal direction (in the positive X direction) by a predetermined distance, e.g., 1 mm (step A5 in FIG. 5H). In this manner, the transfer arm 32 returns to the original loading position in the step A1.

Next, as shown in FIG. 5F, the wafer W is delivered from the support pins 23 to the transfer arm 32 by moving the transfer arm 32 vertically upward (step A6 in FIG. 5H). In the step A6, the wafer W may be delivered from the support pins 23 to the transfer arm 32 by moving the support pins 23 vertically downward.

Then, as shown in FIG. 5G, the transfer arm 32 is moved in the negative X direction that is the horizontal direction and made to pass through the space between the light emitting part 41a and the light receiving part 41b of the sensor 41. When the wafer W passes through the sensor 41, the light emitted from the light emitting part 41a toward the light receiving part 41b is blocked by the wafer W and the wafer W is detected by the sensor 41. At this time, the horizontal position of the transfer arm 32 is detected from the encoder value of the motor 38 and, thus, the horizontal position of the wafer W with respect to the transfer arm 32 is detected (step A7 in FIG. 5H). In the step A7, the top surface of the transfer arm 32 is not in contact with the backside of the wafer W supported by the support pins 23. Therefore, the horizontal position of the wafer W with respect to the transfer arm 32 becomes the appropriate position without deviation.

The steps A1 to A7 are repeated. Whenever the steps A1 to A7 are executed, the reference position of the top surface of the transfer arm 32 in the step A1 is shifted vertically upward by a predetermined distance, e.g., 0.1 mm. Specifically, a reference position Z2 in a step A1 at the second time is higher than the reference position Z1 by 0.1 mm (Z2=Z1+0.1), and a reference position Z3 in a step A1 at the third time is higher than the reference position Z2 by 0.1 mm (Z3=Z2+0.1).

FIGS. 6A to 6G show steps A1 to A7 at the $n^{th}$ time. In the present embodiment, the delivery position Zp of the wafer W in the steps A1 to A7 at the $n^{th}$ time is detected.

Figure 6A:
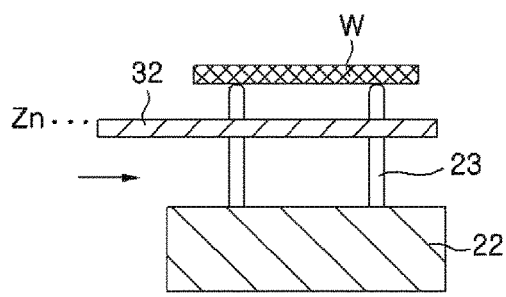

In the step A1, as shown in FIG. 6A, a height position of the top surface of the transfer arm 32 is a reference position Zn.

Figure 6B:
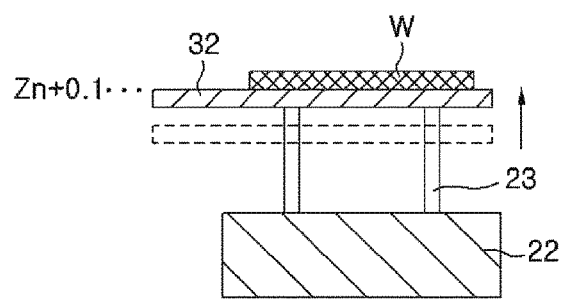

Next, in the step A2, as shown in FIG. 6B, the transfer arm 32 is moved vertically upward by a predetermined distance, e.g., 0.1 mm. At this time, the top surface of the transfer arm 32 is in contact with the backside of the wafer W supported by the support pins 23.

Figure 6C:
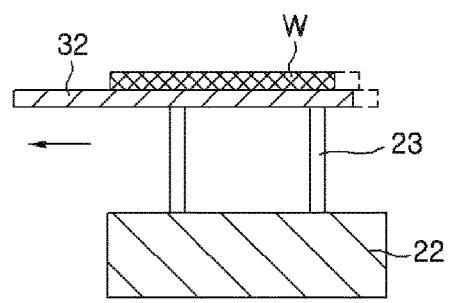

Then, in the step A3, as shown in FIG. 6C, the transfer arm 32 is moved in the negative X direction that is the horizontal direction by a predetermined distance, e.g., mm. At this time, the wafer W is also moved in a horizontal direction by the movement of the transfer arm 32.

Figure 6D:
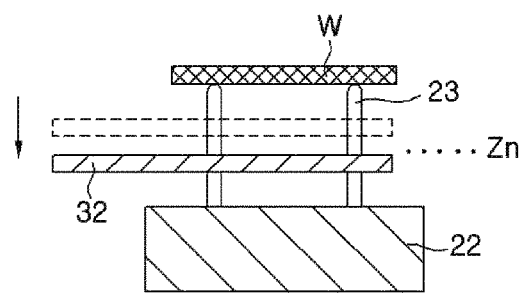
Figure 6D:
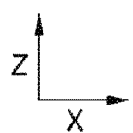

Thereafter, in the step A4, as shown in FIG. 6D, the transfer arm 32 is moved vertically downward by a predetermined distance, e.g., 0.1 mm.

Figure 6E:
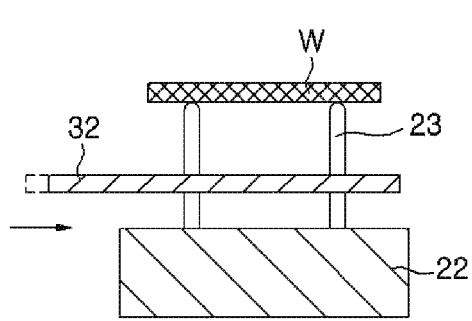

Next, in the step A5, as shown in FIG. 6E, the transfer arm 32 is moved in the positive X direction that is the horizontal direction by a predetermined distance, e.g., 1 mm.

Figure 6F:
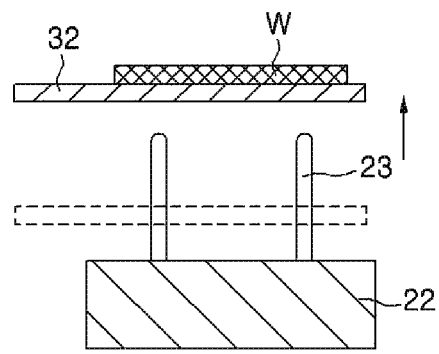

Then, in the step A6, as shown in FIG. 6F, the wafer W is delivered from the support pins 23 to the transfer arm 32 by moving the transfer arm 32 vertically upward.

Figure 6G:
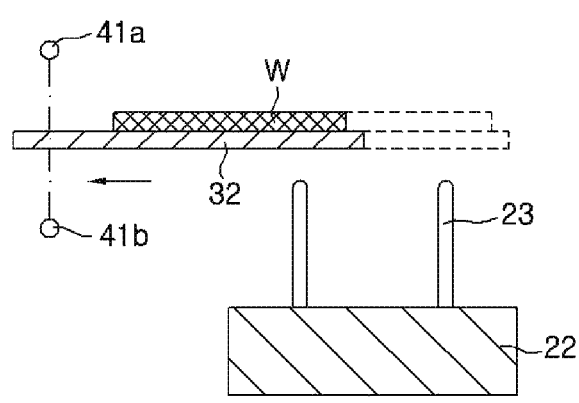

Thereafter, in the step A7, as shown in FIG. 6G, the transfer arm 32 is moved in the negative X direction that is the horizontal direction and thus is made to pass through the space between the light emitting part 41a and the light receiving part 41b of the sensor 41. The horizontal position of the wafer W with respect to the transfer arm 32 is detected from the detection of the wafer W by the sensor 41 and the horizontal position of the transfer arm 32 which is obtained from the encoder value of the motor 38. Since the wafer W has been moved as shown in FIG. 6C, the horizontal position of the wafer W which is detected in the step A7 is deviated from the proper position. Therefore, the delivery position Zp of the wafer W at the $n^{th}$ time is detected. In other words, it is detected that the delivery position Zp of the wafer W is higher than the reference position Zn by 0.1 mm (Zp=Zn+0.1).

The delivery position of the wafer W is taught to the transfer arm 32, and a series of teaching operations are completed.

In the present embodiment, by repeating the steps A1 to A7 and detecting the horizontal position of the wafer W with respect to the transfer arm 32, the delivery position of the wafer W can be taught to the transfer arm 32. When the horizontal position of the wafer W is detected in the step A7, the conventional encoder of the motor 38 and the conventional sensor 41 provided in the substrate processing system 1 are used and a separate teaching jig is not required. Therefore, the teaching of the delivery position of the wafer W can be taught by a simple method. Further, since no teaching jig is required, the teaching cost can be reduced.

In the present embodiment, the teaching can be automatically performed. Therefore, teaching errors that may occur when the teaching is manually performed can be reduced and the teaching can be accurately performed. Further, the number of steps can be reduced compared to that in the case of performing the teaching manually. During the repetition of the steps A1 to A7, the moving distance in the step A4 is not limited to the predetermined distance in the step A2. The moving distance in the step A4 can be set within a range in which the contact between the mounting table 22 and the transfer arm 32 is prevented. For example, the moving distance in the step A4 is set to be greater than the predetermined distance.

3. Second Embodiment of Teaching

Next, a second embodiment of teaching of the delivery position of the wafer W will be described. In the second embodiment, when the teaching is performed, the transfer arm 32 is moved in a vertical direction in a state where the wafer W is held by the transfer arm 32. FIGS. 7A to 7F are views for explaining a teaching operation of the second embodiment, wherein FIGS. 7A to 7E are side views showing states of the transfer arm 32 and the support pins 23, and FIG. 7F schematically shows movement of the transfer arm 32 in the respective steps shown in FIGS. 7A to 7E.

Figure 7A:
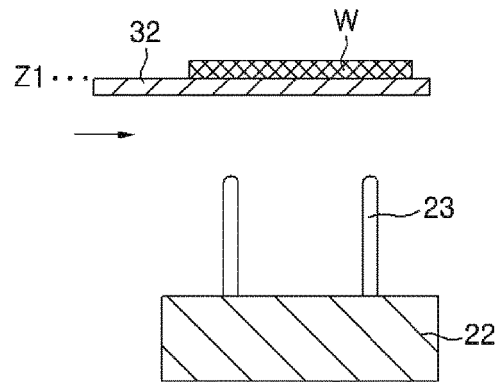
Figure 7B:
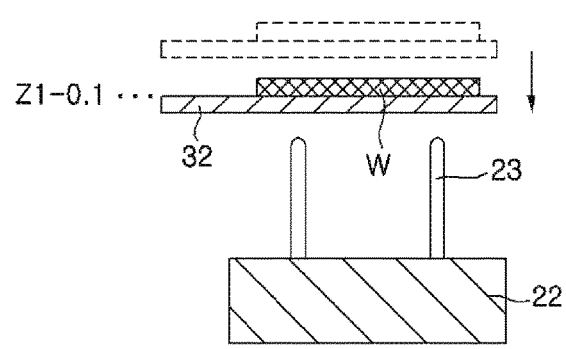
Figure 7C:
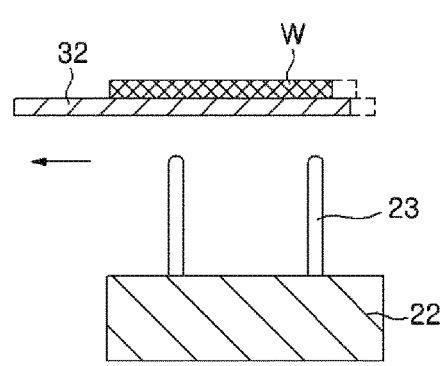
Figure 7D:
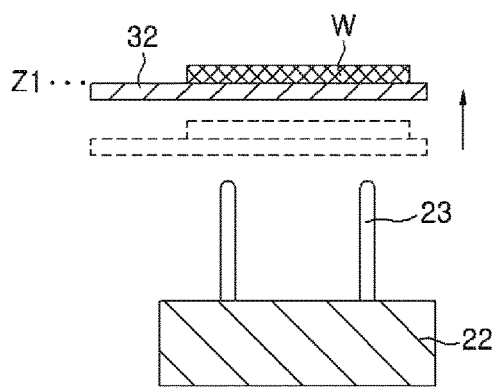
Figure 7E:
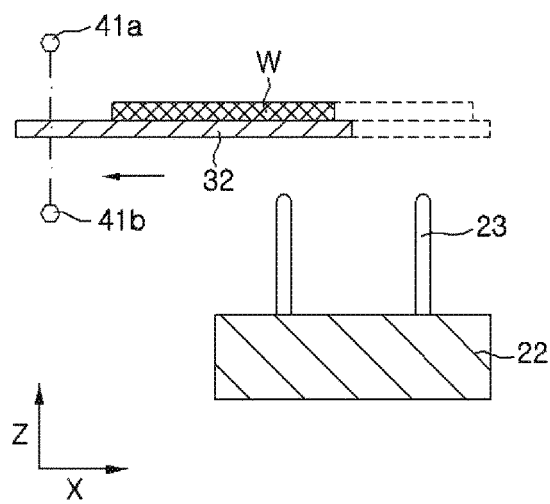
Figure 7F:
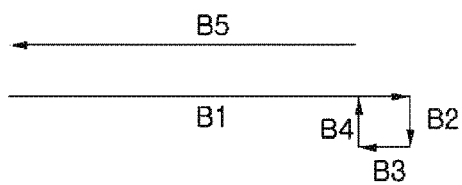

First, as shown in FIG. 7A, the transfer arm 32 is moved in a horizontal direction and positioned above the mounting table 22 (step B1 in FIG. 7F). At this time, a height position of the top surface of the transfer arm 32 is a reference position Z1. Further, the horizontal position of the transfer arm 32 is a proper position at which the wafer W is held by the transfer arm 32.

Next, as shown in FIG. 7B, the transfer arm 32 is moved vertically downward by a predetermined distance, e.g., 0.1 mm (step B2 in FIG. 7F). At this time, leading end portions of the support pins 23 are not in contact with the backside of the wafer W held by the transfer arm 32. The predetermined distance is not limited to 0.1 mm and may be, e.g., 0.2 mm to 0.3 mm.

Then, as shown in FIG. 7C, the transfer arm 32 is moved in a horizontal direction by a predetermined distance, e.g., 1 mm (step B3 in FIG. 7F). At this time, the transfer arm 32 may be moved toward the vacuum transfer chamber 30 side (in the negative X direction) or may be moved toward the opposite side (in the positive X direction). In the present embodiment, the transfer arm 32 is moved in the negative X direction.

Then, as shown in FIG. 7D, the transfer arm 32 is moved vertically upward by a predetermined distance by, e.g. 0.1 mm (step B4 in FIG. 7F). In other words, the height position of the top surface of the transfer arm 32 returns to the reference position Z1.

Next, as shown in FIG. 7E, the transfer arm 32 is moved in the negative X direction that is the horizontal direction and made to pass through the space between the light emitting part 41a and the light receiving part 41b of the sensor 41. The position of the wafer W with respect to the transfer arm 32 is detected from the detection of the wafer W by the sensor 41 and the horizontal position of the transfer arm 32 which is obtained from the encoder value of the motor 38 (step B5 in FIG. 7F). In the step B5, as shown in FIG. 7B, the leading end portions of the support pins 23 are not in contact with the backside of the wafer W held by the transfer arm 32. Therefore, the horizontal position of the wafer W with respect to the transfer arm 32 is not deviated and becomes the proper position.

The steps B1 to B5 are repeated. Whenever the steps B1 to B5 are executed, the reference position of the top surface of the transfer arm 32 in the step B1 is shifted vertically downward by a predetermined distance, e.g., 0.1 mm.

In the steps B1 to B5 at the $n^{th}$ time, the height position of the top surface of the transfer arm 32 in the step B1 becomes the reference position Zn. When the transfer arm 32 is moved in the negative X direction that is the horizontal direction in the step B3, the wafer W is also moved in a horizontal direction by the movement of the transfer arm 32. The horizontal position of the wafer W with respect to the transfer arm 32 which is detected in the step B5 is deviated from the proper position. Therefore, the delivery position of the wafer W in the steps at the $n^{th}$ time is detected. In other words, it is detected that the delivery position Zp of the wafer W is lower than the reference position Zn by 0.1 mm ($Zp=Zn-0.1$).

The delivery position of the wafer W is taught to the transfer arm 32, and a series of teaching operations are completed.

The present embodiment can provide the same effect as that of the first embodiment. In other words, since the teaching of the delivery position of the wafer W can be performed by a simple method, a teaching cost can be reduced and, thus, the teaching can be performed more appropriately. During the repetition of the steps B1 to B5, the moving distance in the step B4 is not limited to the predetermined distance in the step B2. The moving distance in the step B4 can be set within a range in which the movement of the transfer arm 32 holding the wafer W is not disturbed. For example, the moving distance in the step B4 is set to be greater than the predetermined distance.

4. Third Embodiment of Teaching

Next, a third embodiment of teaching of the delivery position of the wafer W will be described. In the third embodiment, when the teaching is performed, the support pins 23 are moved in a vertical direction in a state where the wafer W is held by the transfer arm 32. FIGS. 8A to 8F are views for explaining the teaching operation of the third embodiment, wherein FIGS. 8A to 8E are side views showing state of the transfer arm 32 and the support pins 23, and FIG. 8F schematically shows movement of the transfer arm 32 (indicated by solid arrows) and movement of the support pins (indicated by dotted arrows) in the respective steps shown in FIGS. 8A to 8E.

Figure 8A:
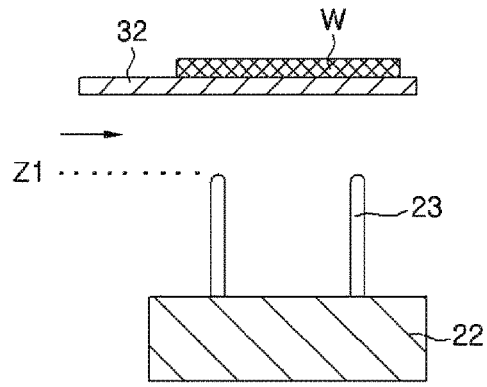
Figure 8B:
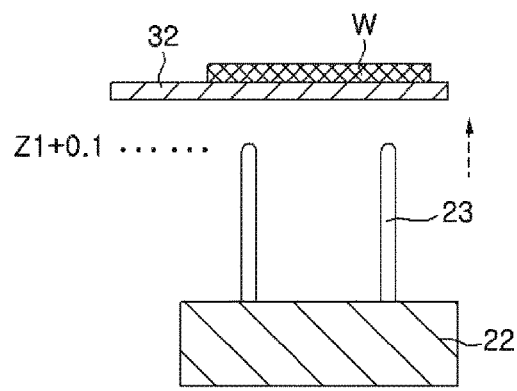
Figure 8C:
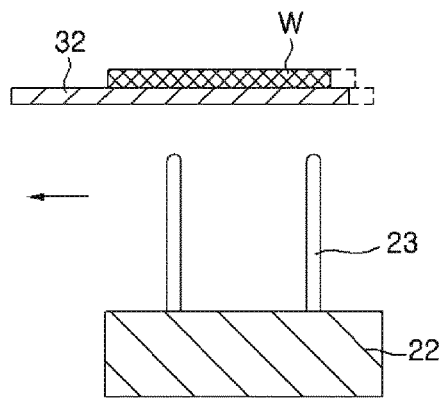
Figure 8D:
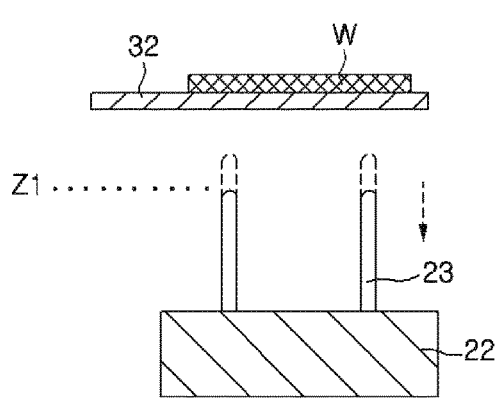
Figure 8E:
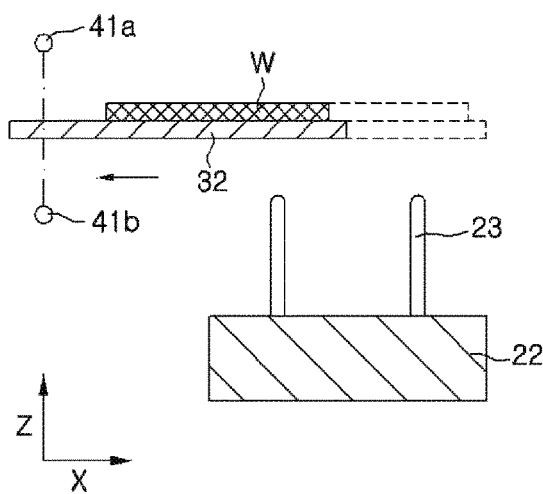
Figure 8F:
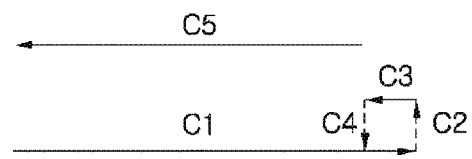

First, as shown in FIG. 8A, in a state where the wafer W is held by the transfer arm 32, the transfer arm 32 is moved in a horizontal direction and positioned above the mounting table 22 (step C1 in FIG. 8F). At this time, the height position of the leading end portions of the support pins 23 is the reference position Z1. The horizontal position of the transfer arm 32 is the proper position at which the wafer W is held by the transfer arm 32.

Next, as shown in FIG. 8B, the support pins 23 are moved vertically upward by a predetermined distance, e.g., 0.1 mm (step C2 in FIG. 8F). At this time, the leading end portions of the support pins 23 are not in contact with the backside of the wafer W held by the transfer arm 32. The predetermined distance is not limited to 0.1 mm and may be, e.g., 0.2 mm to 0.3 mm.

Then, as shown in FIG. 8C, the transfer arm 32 is moved in the horizontal direction by a predetermined distance, e.g., 1 mm (step C3 in FIG. 8F). At this time, the transfer arm 32 may be moved toward the vacuum transfer chamber 30 side (in the negative X direction) or may be moved toward the opposite side (in the positive X direction). However, in the present embodiment, the transfer arm 32 is moved in the negative X direction.

Next, as shown in FIG. 8D, the support pins 23 are moved vertically downward by a predetermined distance, e.g., 0.1 mm (step C4 in FIG. 8F). In other words, the height positions of the leading end portions of the support pins 23 return to the reference position Z1.

Thereafter, as shown in FIG. 8E, the transfer arm 32 is moved in the negative X direction that is the horizontal direction and made to pass through the space between the light emitting part 41a and the light receiving part 41b of the sensor 41. The horizontal position of the wafer W with respect to the transfer arm 32 is detected from the detection of the wafer W by the sensor 41 and the horizontal position of the transfer arm 32 which is obtained from the encoder value of the motor 38 (step C5 in FIG. 8F). In the step C5, as shown in FIG. 8B, the leading end portions of the support pins 23 are not in contact with the backside of the wafer W held by the transfer arm 32. Therefore, the horizontal position of the wafer W with respect to the transfer arm 32 is not deviated and becomes the proper position.

The steps C1 to C5 are repeated. Whenever the steps C1 to C5 are executed, the reference position of the leading end portions of the support pins 23 in the step C1 is shifted upward by a predetermined distance, e.g., 0.1 mm.

In the steps C1 to C5 at the $n^{th}$ time, the height position of the leading end portions of the support pins 23 in the step C1 become the reference position Zn. When the transfer arm 32 is moved in the negative X direction that is the horizontal direction in the step C3, the wafer W is also moved in the horizontal direction by the movement of the transfer arm 32. The horizontal position of the wafer W with respect to the transfer arm 32 which is detected in the step C5 is deviated from the proper position. Therefore, the delivery position Zp of the wafer W in the steps at the $n^{th}$ time is detected. In other words, it is detected that the delivery position Zp of the wafer W is higher than the reference position Zn by 0.1 mm ($Zp=Zn+0.1$).

The delivery position of the wafer W is taught to the transfer arm 32 and/or the support pins 23, and a series of teaching operations are completed.

The present embodiment can provide the same effects as those of the first embodiment and the second embodiment. In other words, since the teaching of the delivery position of the wafer W can be performed by a simple method, a teaching cost can be reduced and, thus, the teaching can be performed more appropriately.

In the present embodiment, the support pins 23 are moved in a vertical direction. For example, the present embodiment is effective particularly when it is difficult to sufficiently move the transfer arm 32 in the vertical direction due to a small size in the vertical direction of the loading/unloading port 40.

In the present embodiment, both of the transfer arm 32 and the support pins 23 are moved. However, in the first embodiment and the second embodiment, only the transfer arm 32 is moved. From the above, it may be considered that the first embodiment and the second embodiment are more effective.

During the repetition of the steps C1 to C5, the moving distance in the step C4 is not limited to the predetermined distance in the step C2. The moving distance in the step C4 can be set within a range in which the movement of the transfer arm 32 holding the wafer W is not disturbed. For example, the moving distance in the step C4 can be set to be greater than the predetermined distance.

5. Fourth Embodiment of Teaching

Next, a fourth embodiment of the teaching of the delivery position of the wafer W will be described. In the fourth embodiment, when the teaching is performed, the support pins 23 are moved in a vertical direction in a state where the wafer W is held by the support pins 23. FIGS. 9A to 9H are views for explaining the teaching operation of the fourth embodiment. FIGS. 9A to 9G are side views showing states of the transfer arm 32 and the support pins 23. FIG. 9H schematically shows movements of the transfer arm 32 and the support pins 23 in the respective steps shown in FIGS. 9A to 9G.

Figure 9A:
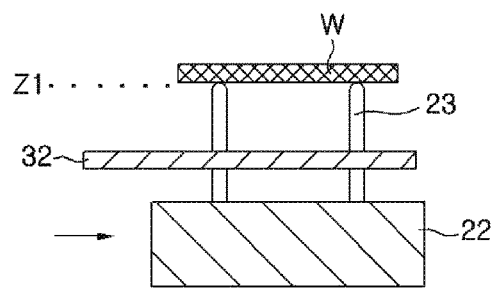
Figure 9B:
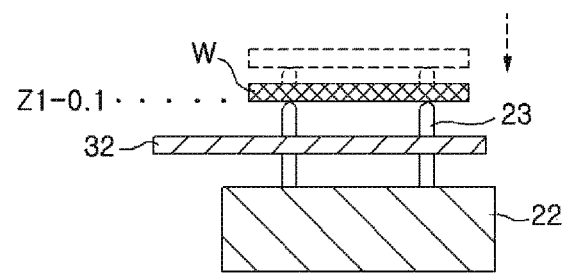
Figure 9C:
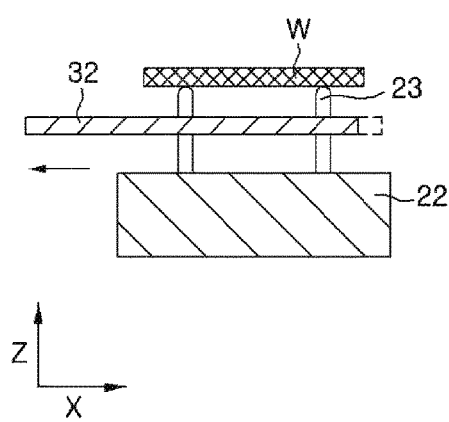
Figure 9D:
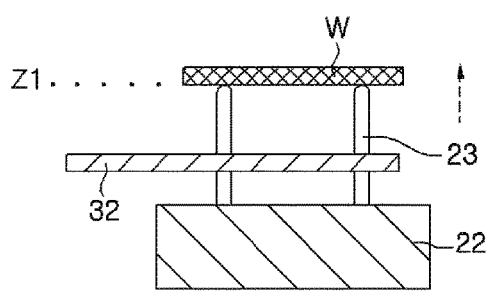
Figure 9E:
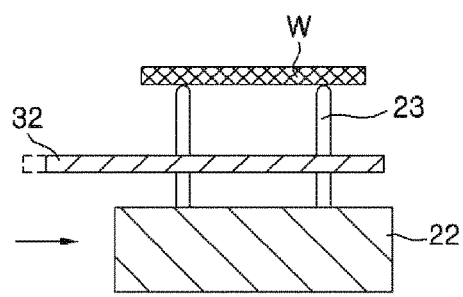
Figure 9F:
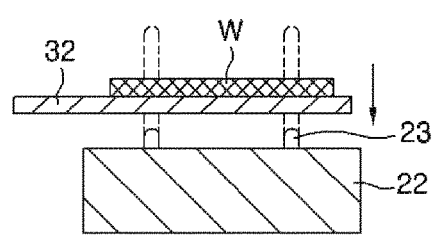
Figure 9G:
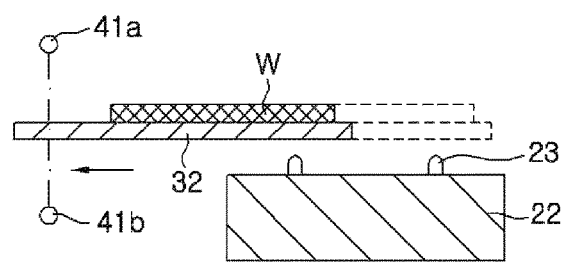
Figure 9H:
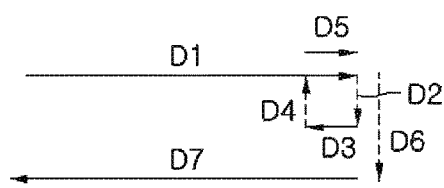
Figure 9H:
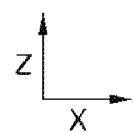

First, as shown in FIG. 9A, the transfer arm 32 is moved in a horizontal direction and positioned above the mounting table 22 (step D1 in FIG. 9H). At this time, the height position of the leading end portions of the support pins 23 are the reference position Z1. The horizontal position of the transfer arm 32 is the proper position at which the wafer W is held by the transfer arm 32.

Next, as shown in FIG. 9B, the support pins 23 are moved vertically downward by a predetermined distance, e.g., 0.1 mm (step D2 in FIG. 9H). At this time, the top surface of the transfer arm 32 is not in contact with the backside of the wafer W held by the support pins 23. The predetermined distance is not limited to 0.1 mm and may be, e.g., 0.2 mm to 0.3 mm.

Then, as shown in FIG. 9C, the transfer arm 32 is moved in a horizontal direction by a predetermined distance, e.g., 1 mm (step D3 in FIG. 9H). At this time, the transfer arm 32 may be moved toward the vacuum transfer chamber 30 side (in the negative X direction) or may be moved toward the opposite side (in the positive X direction). In the present embodiment, the transfer arm 32 is moved in the negative X direction.

Then, as shown in FIG. 9D, the support pins 23 are moved vertically upward by a predetermined distance, e.g., 0.1 mm (step D4 in FIG. 9H). In other words, the height positions of the leading end portions of the support pins 23 return to the reference position Z1.

Thereafter, as shown in FIG. 9E, the transfer arm 32 is moved in the positive X direction that is the horizontal direction by a predetermined distance, e.g., 1 mm (step D5 in FIG. 9H). In this manner, the transfer arm 32 returns to the original loading position in the step D1.

Next, as shown in FIG. 9F, the wafer W is delivered from the support pins 23 to the transfer arm 32 by moving the support pins 23 vertically downward (step D6 in FIG. 9H). In the step D6, the wafer W may be delivered from the support pins 23 to the transfer arm 32 by moving the transfer arm 32 vertically upward.

Then, as shown in FIG. 9G, the transfer arm 32 is moved in the negative X direction that is the horizontal direction and made to pass through the space between the light emitting part 41a and the light receiving part 41b of the sensor 41. The horizontal position of the wafer W with respect to the transfer arm 32 is detected from the detection of the wafer W by the sensor 41 and the horizontal position of the transfer arm 32 which is obtained from the encoder value of the motor 38 (step D7 in FIG. 9H). In the step D7, as shown in FIG. 9B, the top surface of the transfer arm 32 is not in contact with the backside of the wafer W held by the support pins 23. Therefore, the horizontal position of the wafer W with respect to the transfer arm 32 is not deviated and becomes the proper position.

The steps D1 to D7 are repeated. Whenever the steps D1 to D7 are executed, the reference position of the leading end portions of the support pins 23 are shifted vertically downward by a predetermined distance, e.g., 0.1 mm.

In the steps D1 to D7 at the $n^{th}$ time, the height position of the support pins 23 in the step D1 become the reference position Zn. When the transfer arm 32 is moved in the negative X direction that is the horizontal direction in the step D3, the wafer W is also moved in the horizontal direction by the movement of the transfer arm 32. The horizontal position of the wafer W with respect to the transfer arm 32 which is detected in the step D7 is deviated from the proper position. Therefore, the delivery position Zp of the wafer W in the steps at the $n^{th}$ time is detected. In other words, it is detected that the delivery position Zp of the wafer W is lower than the reference position Zn by 0.1 mm (Zp=Zn−0.1).

The delivery position of the wafer W is taught to the transfer arm 32 and/or the support pins 23, and a series of teaching operations are completed.

The present embodiment can provide the same effects as those of the first embodiment to the third embodiment. In other words, the teaching of the delivery position of the wafer W can be performed by a simple method. Thus, the teaching cost can be reduced and the teaching can be performed appropriately. During the repetition of the steps D1 to D7, the moving distance in the step D4 is not limited to the predetermined distance in the step D2. The moving distance in the step D4 can be set within a range that the movement of the transfer arm 32 is not disturbed (e.g., set to be greater than the predetermined distance, for example).

6. Other Embodiments

While the embodiments have been described with reference to the accompanying drawings, the present disclosure is not limited to the above-described examples. It is obvious to those skilled in the art that various modifications or changes can be made within the scope of the claims, and such modifications and changes are included in the technical range of the present disclosure.

In the above embodiments, the sensor used for detecting the horizontal position of the wafer W with respect to the transfer arm 32 in the steps A7, B5, C5 and D7 is not limited to the sensor 41 of the present embodiment and may be arbitrarily set.

Figure 10:
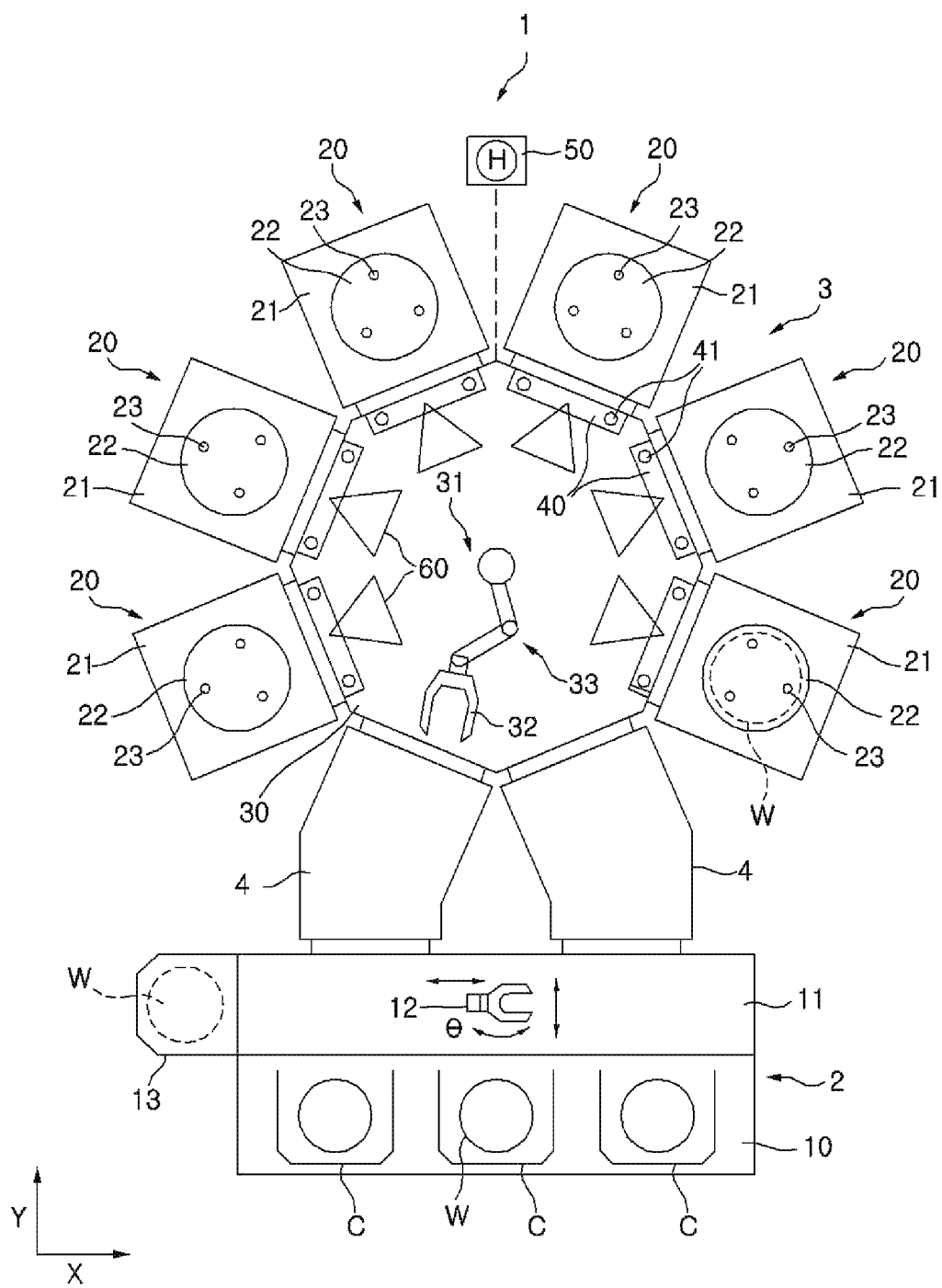
FIG. 10 is a top view schematically showing a configuration of a substrate processing system according to another embodiment.

For example, three line sensors 60 may be used as shown in FIG. 10. The line sensors 60 are disposed at a portion extending from the loading/unloading port 40 to the inside of the vacuum transfer chamber 30. The three line sensors 60 are positioned at vertices of a triangle. The light is emitted from the line sensors 60, and the wafer W held by the transfer arm 32 is detected by detecting the amount of light blocked by the wafer W. At this time, the horizontal position of the wafer W with respect to the transfer arm 32 is detected by detecting the horizontal position of the transfer arm 32 from the encoder value of the motor 38.

For example, the horizontal position of the wafer W with respect to the transfer arm 32 may be detected by the alignment unit 13. In that case, the wafer W needs to be transferred to the alignment unit 13. Thus, the teaching of the delivery position of the wafer W can be effectively performed by using the aforementioned sensors 41 or the line sensors 60.

For example, a camera may be provided instead of the sensors 41 or the line sensors 60 to detect the position of the wafer W.

In any cases, the teaching of the delivery position of the wafer W can be performed by detecting the horizontal position of the wafer W with respect to the transfer arm 32 in the steps A7, B5, C5 and D7.

In the above embodiments, the teaching of the delivery position of the wafer W may be performed under an atmospheric atmosphere. However, it is preferable to perform the teaching under the same atmosphere as that used when the actual processing is performed in the processing apparatus 20.

For example, when the processing in the processing apparatus 20 is performed under a vacuum atmosphere, the teaching is performed under the same vacuum atmosphere. By performing the teaching under the same vacuum atmosphere, the teaching can be performed more accurately. An optical sensor is used for a conventional teaching jig. However, in order to use the optical sensor under a vacuum atmosphere, depressurization is required and this increases a cost.

For example, when the processing in the processing apparatus 20 is performed under a heating atmosphere of, e.g., 400° C. to 700° C., the teaching is performed under the same heating atmosphere. When the processing atmosphere is heated, the components in the processing apparatus 20 are thermally expanded, which causes adverse effects. In that case as well, the teaching can be performed more accurately under the same heating atmosphere. Although an optical sensor is used for a conventional teaching jig, it is originally not possible to use the optical sensor under a heating atmosphere.

In the present disclosure, the conventional jig for teaching is not required. Therefore, the teaching of the delivery position of the wafer can be performed under a vacuum atmosphere or a heating atmosphere, or under both atmospheres.

The configuration of the substrate processing system 1 is not limited to that described in the above embodiment as long as the wafer transfer unit 31 includes the transfer arm 32 and the processing apparatus 20 includes the support pins 23. For example, the present disclosure may be applied to the transfer arm 32 having a configuration different from that described in the above embodiment. The present disclosure may also be applied to the processing apparatus 20 for performing any other processes.

The present disclosure may also be applied to another substrate such as a substrate for use in liquid crystal display, an organic EL device or the like, other than the wafer.

The present disclosure may be applied to the teaching of the delivery position in a vertical direction in the case of delivering the substrate between the arm of the transfer unit and the pins of the processing apparatus.

While the disclosure has been shown and described with respect to the embodiments, it will be understood by those skilled in the art that various changes and modifications may be made without departing from the scope of the disclosure as defined in the following claims.

What is claimed is:

1. A method for determining a delivery position of an arm in a vertical direction in a case of transferring a substrate between the arm of a transfer unit and pins of a processing apparatus, the method comprising, under control of a control unit coupled to the processing apparatus:
   a first step of vertically moving the arm or the pins from a reference position in a first direction by a predetermined distance;
   a second step of moving the arm in a horizontal direction;
   a third step of vertically moving the arm or the pins in a second direction opposite to the first direction by a distance equal to or greater than the predetermined distance;
   a fourth step of detecting a horizontal position of the substrate held by the arm with respect to the arm; and
   a fifth step of comparing the horizontal position of the substrate detected in the fourth step and a preset position, wherein the preset position corresponds to a preset horizontal position of the substrate with reference to the arm,
   wherein, when the horizontal position of the substrate detected in the fourth step is identical to the preset position, the reference position is shifted in the first direction by the predetermined distance to a shifted reference position, and the first step to the fifth step are repeated based on the shifted reference position, and
   wherein, when the horizontal position of the substrate detected in the fourth step deviates from the preset position, a vertical position of the arm or the pins after the first step and before the third step is determined as the delivery position.

2. The method of claim 1, wherein in the first step, the arm is vertically moved in the first direction in a state where the substrate is held by the pins, and
   between the third step and the fourth step, the arm is moved in a direction opposite to the moving direction in the second step and then the arm is vertically moved in the first direction or the pins are vertically moved in the second direction, so that the substrate is held by the arm.

3. The method of claim 2, wherein the first step to the fifth step are performed at least under a vacuum atmosphere or a heating atmosphere.

4. The method of claim 1, wherein in the first step, the arm is vertically moved in the first direction in a state where the substrate is held by the arm.

5. The method of claim 4, wherein the first step to the fifth step are performed at least under a vacuum atmosphere or a heating atmosphere.

6. The method of claim 1, wherein in the first step, the pins are vertically moved in the first direction in a state where the substrate is held by the arm.

7. The method of claim 6, wherein the first step to the fifth step are performed at least under a vacuum atmosphere or a heating atmosphere.

8. The method of claim 1, wherein in the first step, the pins are vertically moved in the first direction in a state where the substrate is held by the pins, and
   between the third step and the fourth step, the arm is moved in a direction opposite to the moving direction in the second step and then the pins are vertically moved in the first direction or the arm is vertically moved in the second direction, so that the substrate is held by the arm.

9. The method of claim 8, wherein the first step to the fifth step are performed at east under a vacuum atmosphere or a heating atmosphere.

10. The method of claim 1, wherein the first step to the fifth step are performed at least under a vacuum atmosphere or a heating atmosphere.

11. A substrate processing system comprising:
a processing apparatus configured to process a substrate;
a transfer unit configured to transfer the substrate with respect to the processing apparatus, the transfer unit having an arm configured to hold the substrate and movable in a horizontal direction or movable in a vertical direction and a horizontal direction;
pins provided in the processing apparatus and configured to support the substrate, the pins being movable in the vertical direction;
a position detection unit configured to detect a horizontal position of the substrate with respect to the arm;
a control unit configured to determine a delivery position of the arm in the vertical direction in a case of transferring the substrate between the pins and the arm,
wherein the control unit is configured to control the pins, the arm and the position detection unit to perform a first step of vertically moving the arm or the pins from a reference position in a first direction by a predetermined distance, a second step of moving the arm in a horizontal direction, a third step of vertically moving the arm or the pins in a second direction opposite to the first direction by a distance equal to or greater than the predetermined distance, a fourth step of detecting a horizontal position of the substrate held by the arm with respect to the arm, and a fifth step of comparing the horizontal position of the substrate detected in the fourth step and a preset position, wherein the preset position corresponds to a preset horizontal position of the substrate with reference to the arm,
wherein, when the horizontal position of the substrate detected in the fourth step is identical to the preset position, the reference position is shifted in the first direction by the predetermined distance to a shifted reference position and the first step to the fifth step are repeated based on the shifted reference position, and
wherein, when the horizontal position of the substrate detected in the fourth step deviates from the preset position, a vertical position of the arm or the pins after the first step and before the third step is determined as the delivery position.

* * * * *